(12) United States Patent
Okita

(10) Patent No.: US 9,738,992 B2
(45) Date of Patent: Aug. 22, 2017

(54) APPARATUS FOR CLEANING EXHAUST PASSAGE FOR SEMICONDUCTOR CRYSTAL MANUFACTURING DEVICE

(75) Inventor: Kenji Okita, Yonezawa (JP)

(73) Assignee: SUMCO CORPORATION, Tokyo (JP)

( * ) Notice: Subject to any disclaimer, the term of this patent is extended or adjusted under 35 U.S.C. 154(b) by 600 days.

(21) Appl. No.: 13/982,628

(22) PCT Filed: Mar. 29, 2011

(86) PCT No.: PCT/JP2011/057739
§ 371 (c)(1),
(2), (4) Date: Jul. 30, 2013

(87) PCT Pub. No.: WO2012/131888
PCT Pub. Date: Oct. 4, 2012

(65) Prior Publication Data
US 2013/0306109 A1    Nov. 21, 2013

(51) Int. Cl.
*C30B 35/00* (2006.01)
*C30B 15/00* (2006.01)
(Continued)

(52) U.S. Cl.
CPC ............ *C30B 35/007* (2013.01); *C30B 15/00* (2013.01); *C30B 29/06* (2013.01); *C30B 35/00* (2013.01);
(Continued)

(58) Field of Classification Search
CPC ......... C30B 15/00; C30B 29/06; C30B 29/40; C30B 29/42; C30B 29/48; C30B 35/00;
(Continued)

(56) References Cited

U.S. PATENT DOCUMENTS 3,963,444 A * 6/1976 Yamada ............... B01D 53/944
422/109
2003/0094134 A1    5/2003 Minami
(Continued)

FOREIGN PATENT DOCUMENTS

JP          8-51080         2/1996
JP          08051080    *   2/1996
(Continued)

OTHER PUBLICATIONS

Japan Office action, dated Apr. 22, 2014 along with an english translation thereof.
(Continued)

*Primary Examiner* — Michael Kornakov
*Assistant Examiner* — Hua Qi
(74) *Attorney, Agent, or Firm* — Greenblum & Bernstein, P.L.C.

(57) ABSTRACT

Dust that is accumulated in an exhaust passage provided in a chamber, the exhaust passage for discharging gas in the chamber of a semiconductor crystal manufacturing device, is removed by being sucked from the outside of the chamber. Moreover, an opening and closing valve for cleaning that is detachably attached to an opening of the exhaust passage, the opening facing the chamber, is opened and closed intermittently in a suction state. Furthermore, the opening and closing valve for cleaning is driven by a valve driving unit. The dust accumulated in the exhaust passage is removed efficiently, whereby the time required to clean the exhaust passage is shortened and fluctuations of the pressure inside the chamber when a semiconductor crystal is manufactured are suppressed.

8 Claims, 7 Drawing Sheets

(51) Int. Cl.
  *C30B 29/06* (2006.01)
  *C30B 29/40* (2006.01)
  *C30B 29/42* (2006.01)
  *C30B 29/48* (2006.01)

(52) U.S. Cl.
  CPC .............. *C30B 29/40* (2013.01); *C30B 29/42* (2013.01); *C30B 29/48* (2013.01); *Y10T 117/00* (2015.01); *Y10T 117/10* (2015.01)

(58) Field of Classification Search
  CPC . C30B 35/007; Y10T 117/00; Y10T 117/1032
  See application file for complete search history.

(56) References Cited

U.S. PATENT DOCUMENTS

| | | | | |
|---|---|---|---|---|
| 2009/0193964 A1* | 8/2009 | Watanabe | ............. | B60T 13/575 91/376 R |
| 2010/0282776 A1* | 11/2010 | Knopow | ............... | B05B 7/2443 222/145.1 |

FOREIGN PATENT DOCUMENTS

| | | | |
|---|---|---|---|
| JP | 2000-219591 | | 8/2000 |
| JP | 2000219591 A | * | 8/2000 |
| JP | 2001-234345 | | 8/2001 |
| JP | 2002-110565 | | 4/2002 |
| JP | 2002-261030 | | 9/2002 |
| JP | 2002-305190 | | 10/2002 |
| JP | 2002-316896 | | 10/2002 |
| JP | 2002316896 A | * | 10/2002 |
| JP | 2003-332245 | | 11/2003 |
| JP | 2004-224606 | | 8/2004 |
| JP | 2008-214696 | | 9/2008 |
| TW | 554394 | | 9/2003 |

OTHER PUBLICATIONS

Taiwan Office action for Application No. 101106632, mail date is Jul. 2, 2014 along with an English-language translation thereof.
Korea Office action, dated Jan. 27, 2014 along with an english translation thereof.
Taiwan Office action, mail date is Dec. 6, 2013, together with an English-language translation.
PCT/ISA/237 dated May 10, 2011.

* cited by examiner

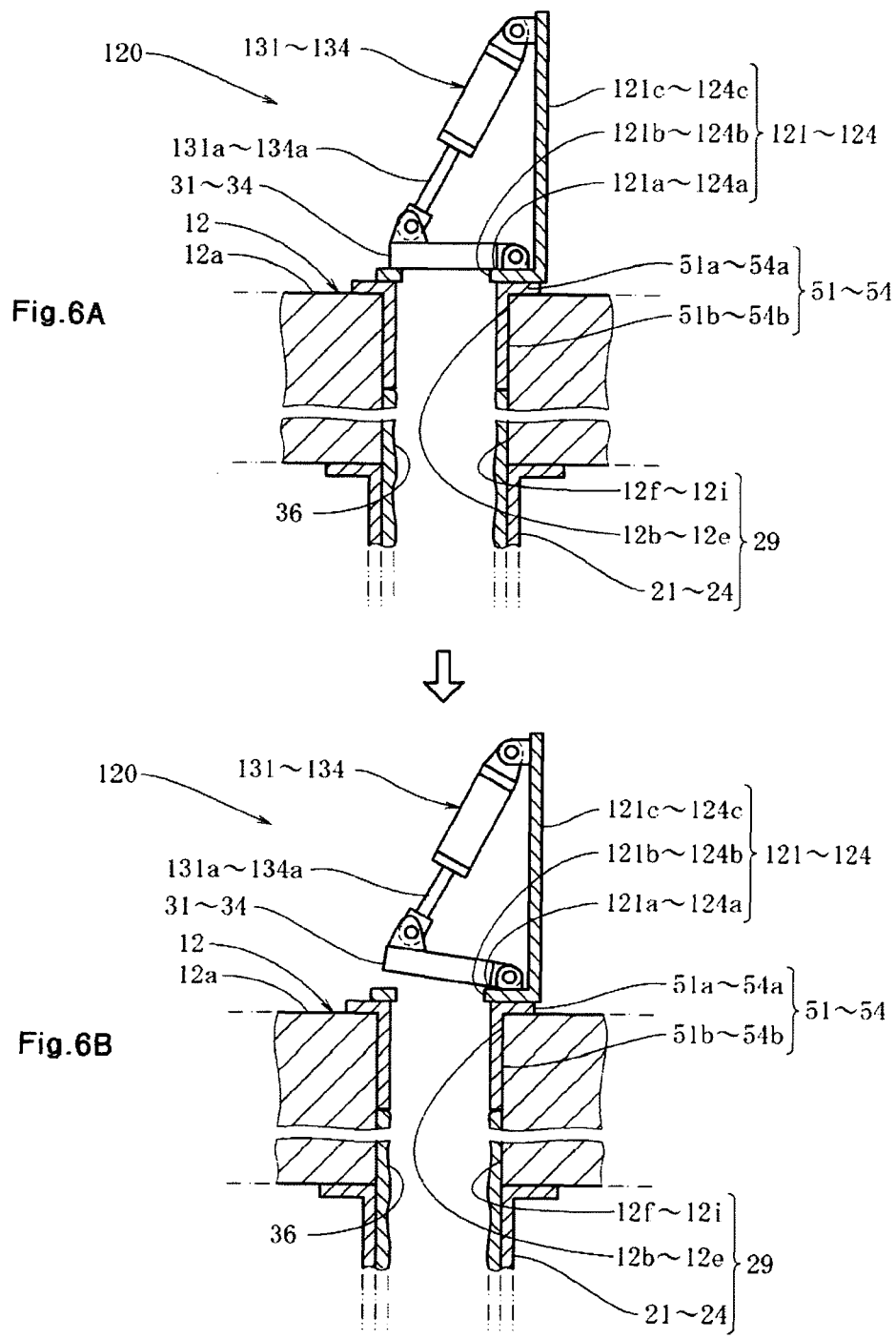

APPARATUS FOR CLEANING EXHAUST PASSAGE FOR SEMICONDUCTOR CRYSTAL MANUFACTURING DEVICE

TECHNICAL FIELD

The present invention relates to an apparatus for cleaning an exhaust passage used in a device for manufacturing a semiconductor crystal such as a silicon single crystal, a silicon polycrystal, a GaAs single crystal, or a GaAs polycrystal and a method for cleaning the exhaust passage.

BACKGROUND ART

In the past, as this type of cleaning apparatus, an apparatus for cleaning an inert-gas exhaust system of a single crystal pulling machine, the cleaning apparatus that is configured such that a vacuum pump sucks the inert gas supplied to the pulling machine through an exhaust pipe connected to the single crystal pulling machine and is configured such that one end of a pipe for cleaning is connected to an outlet for cleaning provided in the exhaust pipe, a suction pump for cleaning is connected to the other end of the pipe for cleaning, and the suction pump for cleaning sucks the inert gas or atmosphere in the exhaust pipe in an atmosphere exposure state in the pulling machine, has been disclosed (refer to, for example, Patent Document 1). In this cleaning apparatus, a powder separator for cleaning is provided in the pipe for cleaning between the outlet for cleaning and the suction pump, and the suction flow rate of the suction pump can be adjusted.

In the cleaning apparatus configured as described above, at the time of cleaning of the inert-gas exhaust system of the single crystal pulling machine, after the inside of the pulling machine is exposed to the atmosphere, one end of the pipe for cleaning is connected to the outlet for cleaning, and the suction pump for cleaning is driven. At this time, since the flow rate of the atmosphere introduced into the exhaust pipe of the suction pump is increased in a step-by-step manner or gradually, the dust accumulated in the exhaust pipe or the like is first burned gradually, and, after the dust is burned completely, the dust comes off the exhaust pipe or the like and is separated and captured by the powder separator for cleaning. As a result, it is possible to remove almost all the dust accumulated in the exhaust pipe in a short time with ease and safety without a sudden increase in the temperature and the pressure in the exhaust pipe.

Patent Document 1: JP-A-2000-219591 (claim 1, paragraph [0038], FIG. 1)

DISCLOSURE OF INVENTION

Problem to be Solved by the Invention

In the above-described existing cleaning apparatus described in Patent Document 1, to suppress sudden burning of the dust accumulated in the exhaust pipe, the flow rate of the atmosphere introduced into the exhaust pipe is increased in a step-by-step manner or gradually. However, even when an attempt to increase the flow rate of the introduced atmosphere rapidly is made after the flow rate of the atmosphere introduced into the exhaust pipe becomes relatively high as a result of the flow rate of the atmosphere introduced into the exhaust pipe being increased in a step-by-step manner or gradually, since there is little difference in pressure, part of the dust which was burned completely does not come off the inner wall of the exhaust pipe and remains attached to the inner wall of the exhaust pipe. As a result, when a silicon single crystal pulling process is performed more than once, the amount of dust accumulated on the inner wall of the exhaust pipe is increased, which makes it necessary to clean the inside of the exhaust pipe on a regular basis every time a predetermined number of pulling processes are performed. At the time of this regular cleaning of the inside of the exhaust pipe, the exhaust pipe has to be detached from a chamber. This has a disadvantage of increasing the time required for the above-described cleaning operation.

Moreover, in the above-described existing cleaning apparatus described in Patent Document 1, when the silicon single crystal pulling process is performed more than once and the amount of dust accumulated on the inner wall of the exhaust pipe is increased, if the next silicon single crystal pulling process is performed in a state in which the exhaust pipe is not cleaned and left as it is, it becomes difficult to control the pressure inside the chamber. This results in large fluctuations of the pressure inside the chamber, which affects the silicon single crystal pulling conditions, or, when the dust accumulated on the inner wall of the exhaust pipe comes off unexpectedly, such dust damages the vacuum pump or the like.

An object of the present invention is to provide an apparatus for cleaning an exhaust passage for a semiconductor crystal manufacturing device and a method for cleaning the exhaust passage, the apparatus and the method that can remove the dust accumulated in the exhaust passage efficiently and thereby shorten the time required to clean the exhaust passage and can suppress fluctuations of the pressure inside a chamber when a semiconductor crystal is manufactured.

Means for Solving Problem

A first aspect of the present invention is an apparatus for cleaning an exhaust passage for a semiconductor crystal manufacturing device, the cleaning apparatus that removes dust that is accumulated in an exhaust passage by sucking the dust from the outside of a chamber, the exhaust passage provided in the chamber to discharge gas in the chamber of a semiconductor crystal manufacturing device, the cleaning apparatus includes: an opening and closing valve for cleaning that is detachably attached to an opening of the exhaust passage, the opening facing the chamber, the opening and closing valve for cleaning that intermittently opens and closes the opening in a suction state; and a valve driving unit driving the opening and closing valve for cleaning.

A second aspect of the present invention is the invention based on the first aspect, wherein an insertion tube having a flange portion making contact with an end face of the opening, the insertion tube that can be inserted into the opening, and a valve holder that is attached to the flange portion and holds the opening and closing valve for cleaning are further provided.

A third aspect of the present invention is the invention based on the second aspect, wherein the valve holder is further provided in such a way as to extend in a direction away from the insertion tube and has a handle at the tip thereof.

A fourth aspect of the present invention is the invention based on the second aspect, wherein a hook is further attached to the valve holder.

A fifth aspect of the present invention is the invention based on the first aspect, wherein, additionally, the valve driving unit is a fluid pressure cylinder.

A sixth aspect of the present invention is the invention based on the first or fifth aspect, wherein, additionally, the intermittent opening-and-closing cycle of the opening by the valve driving unit is 1 to 30 seconds.

A seventh aspect of the present invention is a method for cleaning an exhaust passage for a semiconductor crystal manufacturing device, the cleaning method by which dust that is accumulated in an exhaust passage is removed by sucking the dust from the outside of a chamber, the exhaust passage provided in the chamber to discharge gas in the chamber of a semiconductor crystal manufacturing device, an atmosphere introduction process in which an opening of the exhaust passage, the opening facing the chamber, is opened and the atmosphere is introduced into the exhaust passage and an atmosphere discharge process in which the atmosphere in the exhaust passage is discharged by suction of the atmosphere introduced into the exhaust passage by closing the opening are performed in such a way that each process is performed once or are repeated more than once.

An eighth aspect of the present invention is the invention based on the seventh aspect, wherein, additionally, the repetition cycle of the atmosphere discharge process and the atmosphere introduction process is 1 to 30 seconds.

Effect of the Invention

In the cleaning apparatus of the first aspect of the present invention, since the opening and closing valve for cleaning that is detachably attached to the opening of the exhaust passage, the opening facing the chamber, intermittently opens and closes the opening in a suction state and the valve driving unit drives the opening and closing valve for cleaning, the pressure inside the exhaust passage fluctuates greatly. That is, pressure fluctuations, in which the exhaust passage becomes a negative pressure when the opening and closing valve is closed and the exhaust passage returns to the atmospheric pressure when the opening and closing valve is opened, occur in the exhaust passage. This makes it possible to remove the dust accumulated in the exhaust passage efficiently. As a result, there is no need to detach the exhaust pipe or the like when the exhaust passage is cleaned, making it possible to shorten the time required to clean the exhaust passage. Moreover, since it is possible to remove all the dust accumulated in the exhaust passage on a regular basis every time a semiconductor crystal manufacturing process is performed more than once, it is possible to suppress pressure fluctuations in the chamber when a semiconductor crystal is manufactured and thereby prevent the pressure fluctuations in the chamber from affecting the semiconductor manufacturing conditions.

In the cleaning apparatus of the second aspect of the present invention, since the insertion tube is inserted in the opening in a state in which the opening and closing valve for cleaning is held by the valve holder attached to the flange portion of the insertion tube, it is possible to open and close the opening reliably in a state in which the opening and closing valve for cleaning is stabilized.

In the cleaning apparatus of the third aspect of the present invention, by inserting the insertion tube into the opening while holding the handle at the tip of the valve holder, even when the opening is formed in the bottom wall of a relatively deep chamber, it is possible to insert the insertion tube into the opening with ease.

In the cleaning apparatus of the fourth aspect of the present invention, by inserting the insertion tube into the opening while holding the hook attached to the valve holder, even when the opening is formed in the side wall near the bottom wall of a relatively deep chamber, it is possible to insert the insertion tube into the opening with ease.

In the cleaning method of the seventh aspect of the present invention, since the atmosphere introduction process in which an opening of the exhaust passage is opened and the atmosphere is introduced into the exhaust passage and the atmosphere discharge process in which the atmosphere in the exhaust passage is discharged by closing the opening are performed in such a way that each process is performed once or are repeated more than once, the pressure inside the exhaust passage fluctuates greatly, which makes it possible to remove the dust accumulated in the exhaust passage efficiently. As a result, as is the case with that described above, there is no need to detach the exhaust pipe or the like when the exhaust passage is cleaned, making it possible to shorten the time required to clean the exhaust passage. Moreover, since it is possible to remove all the dust accumulated in the exhaust passage on a regular basis every time a semiconductor crystal manufacturing process is performed more than once, it is possible to suppress pressure fluctuations in the chamber when a semiconductor crystal is manufactured and thereby prevent the pressure fluctuations in the chamber from affecting the semiconductor manufacturing conditions.

BRIEF DESCRIPTION OF DRAWINGS

FIG. 6A and 6B are sectional views of a principal portion, the sectional view of a state in which an insertion tube of a cleaning apparatus of a second embodiment of the present invention is inserted into an opening and an opening and closing valve for cleaning is opened and closed by an air cylinder.

BEST MODES FOR CARRYING OUT THE INVENTION

Next, modes for carrying out the present invention will be described based on the drawings.

<First Embodiment>

Figure 2:
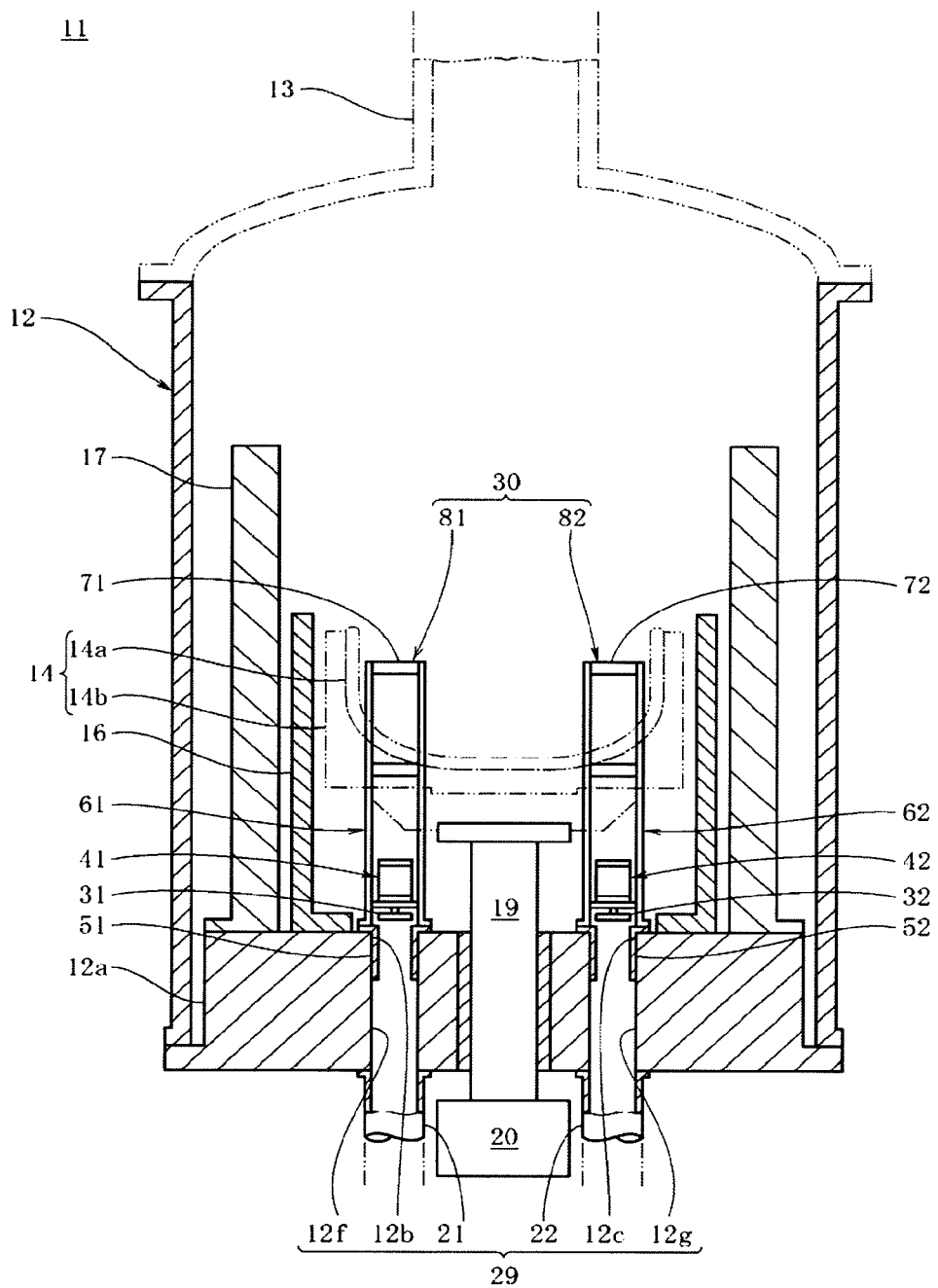
FIG. 2 is a longitudinal sectional view of a state in which a casing and a crucible of a silicon single crystal pulling device are detached from a chamber and the insertion tubes of the cleaning apparatus are inserted into the openings.
Figure 3:
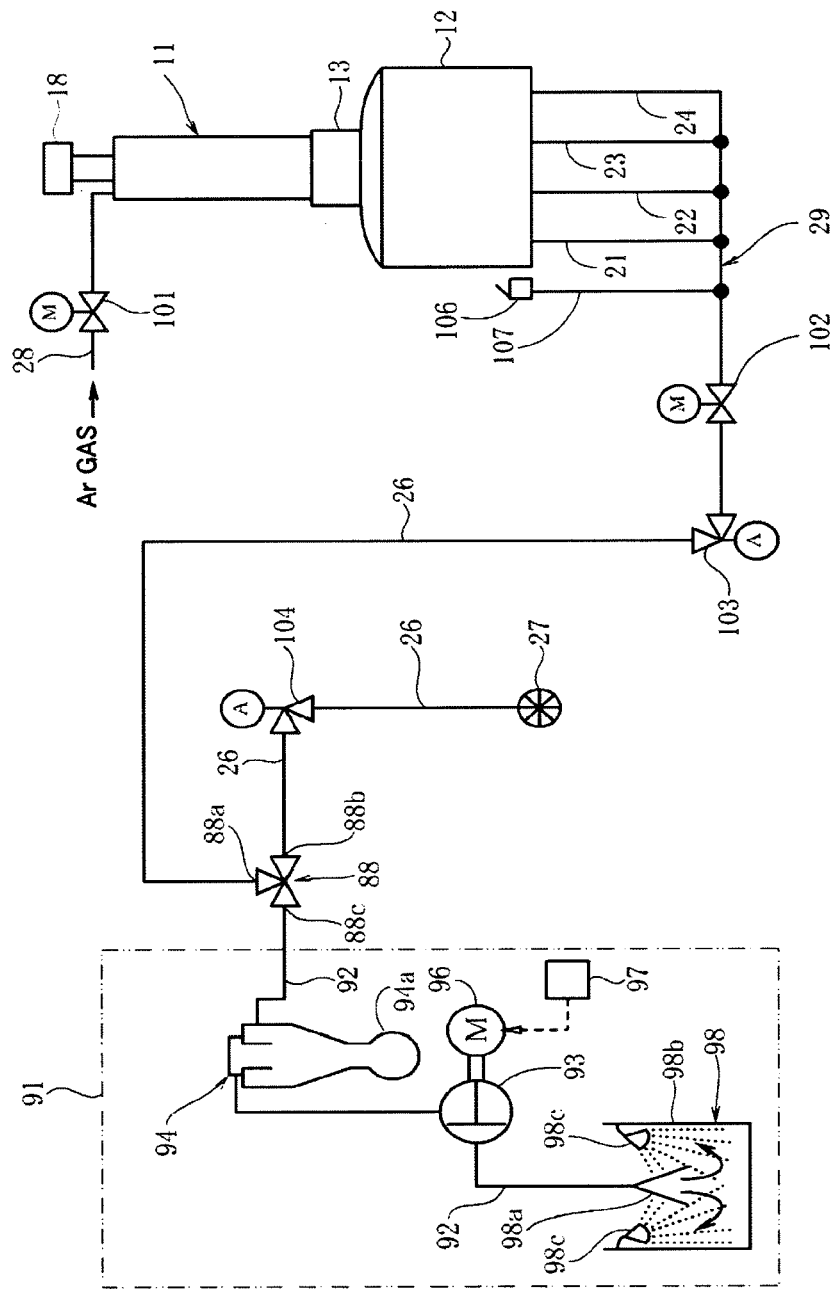
FIG. 3 is a configuration diagram of a state in which a dust burning and separating device that burns the dust accumulated in an exhaust passage and separates most of the dust is connected at some midpoint of an exhaust pipe of the silicon single crystal pulling device.

As shown in FIGS. 2 and 3, in this embodiment, a semiconductor crystal is a silicon single crystal, and a semiconductor crystal manufacturing device 11 is a silicon single crystal pulling device. The silicon single crystal pulling device 11 includes a chamber 12 having a bottom wall 12a and an open top end and a casing 13 connected to the top end of the chamber 12. In the chamber 12, a crucible 14 in which silicon melt (not shown) is stored, a cylindrical heater 16 that surrounds the crucible 14 with predetermined clearance left between them and heats the silicon melt, a heat insulating tube 17 that surrounds the heater 16 with predetermined clearance left between them, and other components are housed (FIG. 2). Moreover, at the top end of the casing 13, a pulling unit 18 that pulls a silicon single crystal upwardly is provided (FIG. 3). The crucible 14 is formed of an inner container 14a made of quartz in the form of a closed-end cylinder, the inner container 14a in which the silicon melt is stored, and an outer container 14b made of graphite in the form of a closed-end cylinder, the outer container 14b fitted onto the outside of the inner container 14a. To the bottom of the outer container 14b, the top end of a shaft 19 is connected, and, at the lower end of the shaft 19, a crucible driving unit 20 that rotates the crucible 14 and moves the crucible 14 upward and downward via the shaft 19 is provided (FIG. 2).

Figure 1A:
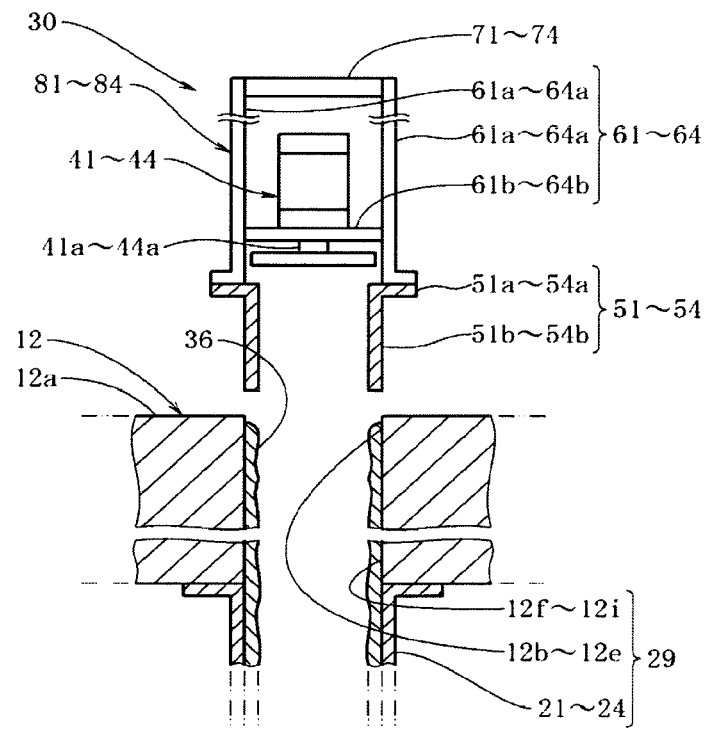
FIG. 1A and 1B are sectional views of a principal portion, the sectional view showing a procedure by which an insertion tube of a cleaning apparatus of a first embodiment of the present invention is inserted into an opening.
Figure 1B:
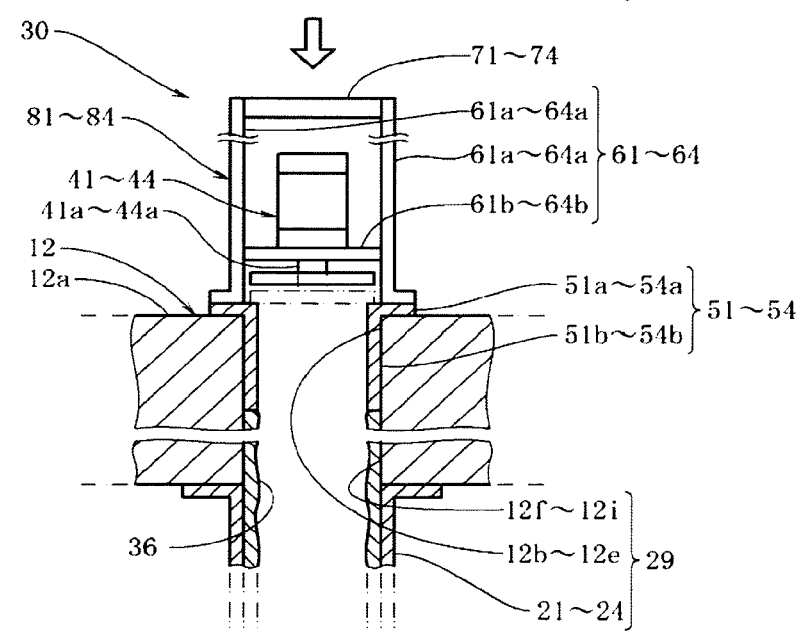

On the other hand, in the bottom wall 12a of the chamber 12, four first to fourth openings 12b to 12e facing the chamber 12 are respectively formed, and the first to fourth openings 12b to 12e form the top ends of four first to fourth communicating holes 12f to 12i extending in a vertical direction and penetrating the bottom wall 12a (FIGS. 1 and 2). To the lower ends of these communicating holes 12f to 12i, the base ends of four first to fourth exhaust pipes 21 to 24 are respectively connected, and the tips of the first to fourth exhaust pipes 21 to 24 are collectively connected to the base end side of a single collective exhaust pipe 26 (FIG. 3). Moreover, to the other end of the collective exhaust pipe 26, a vacuum pump 27 is connected. Furthermore, a reference numeral 28 in FIG. 3 denotes an inlet pipe with one end connected to the top face of the casing 13. The other end of the inlet pipe 28 is connected to a tank (not shown) in which inert gas (in this embodiment, Ar gas) is stored. The above-described first to fourth openings 12b to 12e, first to fourth communicating holes 12f to 12i, first to fourth exhaust pipes 21 to 24, and collective exhaust pipe 26 form an exhaust passage 29 of the inert gas. In addition, the inert gas in the tank flows into the chamber 12 through the inlet pipe 28 and the casing 13 and is discharged by the vacuum pump 27 through the exhaust passage 29 after taking in dust 36 such as SiO or $SiO_2$ in the chamber 12.

The dust 36 such as SiO or $SiO_2$ contained in the above-described inert gas is accumulated on the inner wall of the exhaust passage 29, and the dust 36 accumulated in the exhaust passage 29 is removed by a cleaning apparatus 30. The cleaning apparatus 30 includes disk-shaped first to fourth opening and closing valves for cleaning 31 to 34 that are detachably attached to the first to fourth openings 12b to 12e of the exhaust passage 29, the first to fourth openings 12b to 12e facing the chamber 12, and intermittently open and close the first to fourth openings 12b to 12e, respectively, in a suction state and first to fourth valve driving units 41 to 44 that drive the opening and closing valves for cleaning 31 to 34, respectively. Moreover, the cleaning apparatus 30 further includes first to fourth insertion tubes 51 to 54 having first to fourth flange portions 51a to 54a, respectively, making contact with the end faces of the first to fourth openings 12b to 12e and first to fourth valve holders 61 to 64 attached to the first to fourth flange portions 51a to 54a, respectively. The first to fourth valve driving units 41 to 44 are first to fourth air cylinders in this embodiment. Furthermore, the first to fourth insertion tubes 51 to 54 have first to fourth tube bodies 51b to 54b that are formed into a cylindrical shape, the first to fourth tube bodies 51b to 54b that can be inserted into the first to fourth openings 12b to 12e, and the first to fourth flange portions 51a to 54a, each being integrally provided at an end of a corresponding one of the tube bodies 51b to 54b, the first to fourth flange portions 51a to 54a whose outside diameters are greater than the outside diameters of the tube bodies 51b to 54b. Moreover, the first to fourth valve holders 61 to 64 have first to fourth leg portions 61a to 64a, each being formed of a plurality of portions, the first to fourth leg portions 61a to 64a that are provided in the first to fourth flange portions 51a to 54a in a standing manner and are provided in such a way as to extend in a direction away from the first to fourth insertion tubes 51 to 54, and first to fourth retainer plates 61b to 64b, each being formed of a single portion, the first to fourth retainer plates 61b to 64b that are provided in positions of the leg portions 61a to 64a, the positions slightly away from the first to fourth flange portions 51a to 54a, respectively, in such a way as to extend in a horizontal direction and respectively supported by the first to fourth leg portions 61a to 64a, each being formed of a plurality of portions. To the first to fourth retainer plates 61b to 64b, the first to fourth air cylinders 41 to 44 are attached in a state in which first to fourth piston rods 41a to 44a are protruded downward, and, to the lower ends of the first to fourth piston rods 41a to 44a, the above-described first to fourth opening and closing valves for cleaning 31 to 34 are attached. That is, the first to fourth opening and closing valves for cleaning 31 to 34 are held by the first to fourth valve holders 61 to 64, respectively, via the first to fourth air cylinders 41 to 44. Incidentally, though not shown in the drawing, in each of the first to fourth opening and closing valves for cleaning 31 to 34, a small through hole is formed in such a way as to penetrate through the opening and closing valve for cleaning or a slit is formed in the bottom face. This is because, when the exhaust passage 29 is made airtight, the air cylinders 41 to 44 may be overloaded. Moreover, though not shown in the drawing, in each of the first to fourth retainer plates 61b to 64b, an air inlet port may be formed. This is formed to introduce the air inside the chamber 12 into the exhaust passage 29 smoothly through the inlet port.

Furthermore, to the top ends of the first to fourth leg portions 61a to 64a, each being formed of a plurality of portions, of the first to fourth valve holders 61 to 64, first to fourth handles 71 to 74 are respectively attached. In addition, in a state in which the first to fourth insertion tubes 51 to 54 are inserted in the first to fourth openings 12b to 12e of the exhaust passage 29, the first to fourth opening and closing valves for cleaning 31 to 34 are driven by the first to fourth air cylinders 41 to 44 to open and close the first to fourth openings 12b to 12e intermittently. The intermittent opening-and-closing cycle of the first to fourth openings 12b to 12e by the first to fourth air cylinders 41 to 44, that is, the repetition cycle of a process in which a suction pump for cleaning 93, which will be described later, is driven in a state in which the first to fourth openings 12b to 12e are closed by the first to fourth opening and closing valves for cleaning 31 to 34 to discharge the atmosphere in the exhaust passage 29 and a process in which the first to fourth openings 12b to 12e are opened to introduce the atmosphere into the exhaust passage 29 is set at 1 to 30 seconds, preferably 2 to 5 seconds. Here, the reason why the intermittent opening-and-closing cycle of the first to fourth openings 12b to 12e by the first to fourth air cylinders 41 to 44 is controlled to within the limits of 1 to 30 seconds is because, when the cycle is less than 1 second, a pressure difference large enough to separate the dust 36 adhering to the exhaust passage 29 is not produced in the exhaust passage 29 and, when the cycle exceeds 30 seconds, a pressure difference in the exhaust passage 29 remains about the same, reducing the efficiency of the cleaning of the exhaust passage 29. Incidentally, a pressure difference large enough to separate the dust 36 adhering to the inner wall of the exhaust passage 29, that is, a difference between the pressure (negative pressure) inside the exhaust passage when the first to fourth openings 12b to 12e are closed by the first to fourth opening and closing valves for cleaning 31 to 34 and the pressure (atmospheric pressure) inside the exhaust passage when the first to fourth openings 12b to 12e are opened by the first to fourth opening and closing valves for cleaning 31 to 34 in a state in which the suction pump for cleaning 93 is being driven is set at 0.02 MPa or more, preferably 0.1 MPa or more. Moreover, in this embodiment, a suction state of the exhaust passage 29 including the first to fourth openings 12b to 12e is generated as a result of the suction pump for cleaning 93 of a device for burning and separating the dust 36, which will be described later, being driven.

Figure 4:
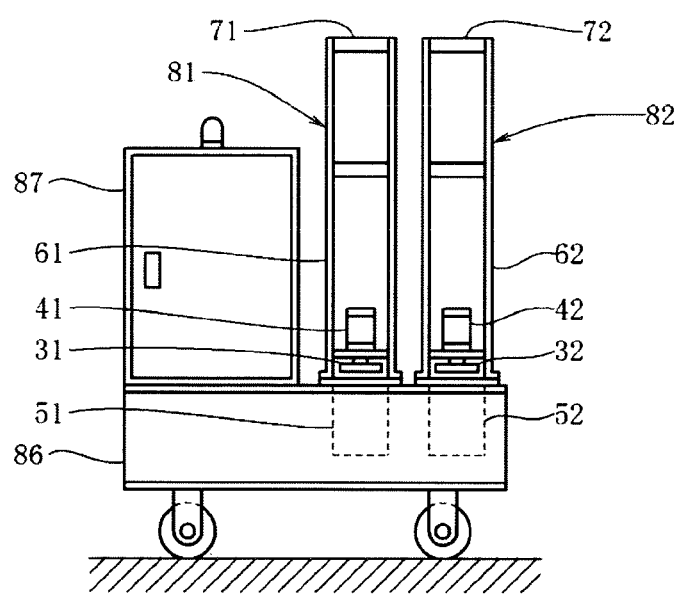
FIG. 4 is a side view of a platform truck, the side view of a state in which the cleaning apparatus is placed on the platform truck and a control box controlling an opening and closing valve for cleaning is mounted on the platform truck.
Figure 5:
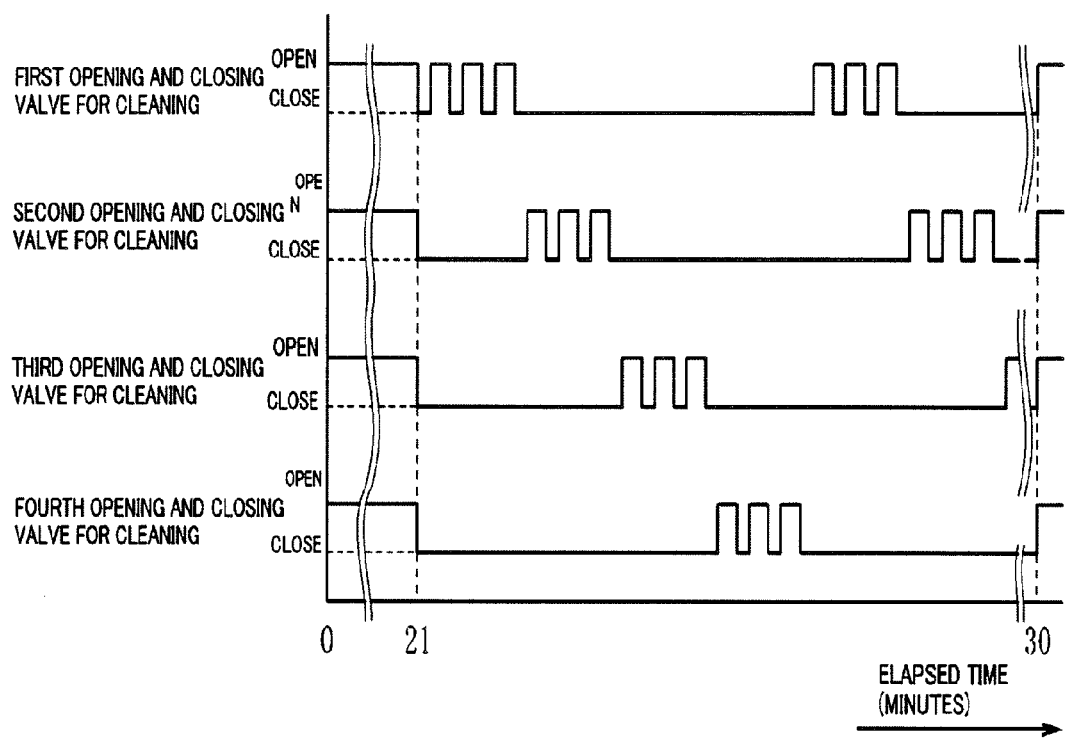
FIG. 5 is a time chart of the times at which four opening and closing valves for cleaning are opened and closed individually.

The above-described first to fourth opening and closing valves for cleaning 31 to 34, first to fourth air cylinders 41 to 44, first to fourth insertion tubes 51 to 54, first to fourth valve holders 61 to 64, and first to fourth handles form first to fourth opening opening-and-closing units 81 to 84. The first to fourth opening opening-and-closing units 81 to 84 are carried on a platform truck 86 (FIG. 4). On this platform truck 86, a control box 87 is mounted. In the control box 87, a controller (not shown) that controls opening and closing of the first to fourth opening and closing valves for cleaning 31 to 34 by driving the first to fourth air cylinders 41 to 44 is housed. Moreover, in the control box 87, first to fourth solenoid controlled valves (not shown) that perform switching in such a way as to make first to fourth piston rods 41a to 44a of the first to fourth air cylinders 41 to 44 stick out are housed. The first to fourth air cylinders 41 to 44 and the first to fourth solenoid controlled valves are connected by air tubes (not shown). Furthermore, to the control output of the controller, the first to fourth solenoid controlled valves are electrically connected. In addition, in the controller, a memory (not shown) is provided, and, in this memory, a time chart (FIG. 5) by which the first to fourth solenoid controlled valves are controlled in such a way that the first to fourth opening and closing valves for cleaning 31 to 34 are opened and closed, not at the same time but at different times, one by one three times each time (the number of opening and closing operations can be set at an arbitrary number) is stored as a map.

On the other hand, in the collective exhaust pipe 26, a manual three-way change-over valve 88 is provided. A first port 88a of the change-over valve 88 is connected to the collective exhaust pipe 26 on the side where the pulling device 11 is located, and a second port 88b is connected to the collective exhaust pipe 26 on the side where the vacuum pump 27 is located. Moreover, to a third port 88c, one end of a pipe for cleaning 92 of a dust burning and separating device 91 that burns the dust 36 accumulated in the exhaust passage 29 and separates most of the dust 36 is connected. That is, the above-described third port 88c becomes an outlet for cleaning. Furthermore, in this embodiment, the dust burning and separating device 91 forms part of the cleaning apparatus 30 of the present invention. Incidentally, as the vacuum pump, a combination of a water seal pump and a mechanical booster, an oil-sealed rotary vacuum pump, a dry vacuum pump, or the like is used.

The dust burning and separating device 91 has the above-described pipe for cleaning 92 having one end detachably connected to the outlet for cleaning 88c (the third port), the suction pump for cleaning 93 that is connected to the other end of the pipe for cleaning 92 and sucks the Ar gas or atmosphere in the exhaust passage 29 in a state in which the inside of the pulling device 11 is exposed to the atmosphere, and a powder separator for cleaning 94 that is provided in the pipe for cleaning 92 between the collective exhaust pipe 26 and the suction pump for cleaning 93. When the above-described dust burning and separating device 91 is used and when the first to fourth opening opening-and-closing units 81 to 84 are operated, one end of the pipe for cleaning 92 is connected to the above-described outlet for cleaning 88c and switching is performed in such a way that the first port 88a communicates with the outlet for cleaning 88c. Moreover, except when the dust burning and dust device 91 is used and except when the first to fourth opening opening-and-closing units 81 to 84 are operated, the pipe for cleaning 92 is detached from the outlet for cleaning 88c and switching is performed in such a way that the first port 88a communicates with the second port 88b.

In this embodiment, the powder separator for cleaning 94 is a cyclone for cleaning. In the cyclone for cleaning 94, the inside diameter of the pipe for cleaning 92 is considerably reduced just before the entrance of the cyclone for cleaning 94 in order to enhance separation capacity of the cyclone 94 to separate the dust 36, and a dust chamber for cleaning 94a is provided at a lower end of the cyclone 94. Moreover, the suction pump for cleaning 93 is driven by an induction motor 96. The rotation speed of the induction motor 96 is controlled by frequency control performed by an inverter 97, making it possible to adjust the suction flow rate (the flow rate of the Ar gas or atmosphere in the exhaust passage) of the suction pump for cleaning 93.

Furthermore, in the dust burning and separating device 91, a scrubber for cleaning 98 that captures the dust 36 that has flowed into the pipe for cleaning 92 and has passed through the cyclone for cleaning 94 is provided. The scrubber 98 has a funnel 98a for a scrubber, the funnel 98a connected to an exhaust port of the suction pump for cleaning 93 via the pipe for cleaning 92, a tank 98b for a scrubber, the tank 98b in which the funnel 98a is inserted, and a plurality of shower nozzles 98c for a scrubber, the shower nozzles 98c attached to an upper inner edge of the tank 98b. The funnel 98a for a scrubber is formed in such a way as to spread gradually downward to reduce the flow rate of the Ar gas or atmosphere discharged from the suction pump for cleaning 93, and liquid (in this embodiment, water) is sprayed out of the shower nozzles 98c for a scrubber. The dust 36 is captured as a result of the dust 36 contained in the Ar gas or atmosphere discharged from the funnel 98a for a scrubber adhering to the sprayed liquid.

In addition, the above-described dust burning and separating device 91, that is, the pipe for cleaning 92, the suction pump for cleaning 93, the cyclone for cleaning 94, the induction motor 96, the inverter 97, and the scrubber for cleaning 98 are mounted on a base (not shown) with wheels and can be carried. Incidentally, reference numerals 101 and 102 in FIG. 3 denote motor-driven control valves that control the pressure inside the chamber 12 by individually adjusting the flow rate of the Ar gas flowing through the inlet pipe 28 and the collective exhaust pipe 26, and reference numerals 103 and 104 denote air operated angle valves that open and close the collective exhaust pipe 26. Furthermore, a reference numeral 106 denotes a flapper valve provided at the top end of a branch exhaust pipe 107 branched off from the collective exhaust pipe 26 at some midpoint thereof, and this valve 106 is provided to expose the inside of the exhaust passage 29 to the atmosphere when the dust 36 accumulated on the inner wall of the exhaust passage 29 is burned and the pressure inside the exhaust passage 29 is increased rapidly.

The operation of the cleaning apparatus 30 configured as described above will be described. After a few hundred hours have elapsed after the silicon single crystal pulling device 11 was operated for a predetermined time, for example, a silicon single crystal was pulled upwardly ten times, the vacuum pump is stopped, and the inside of the chamber 12 is exposed to the atmosphere by removing the casing 13 and the crucible 14 of the pulling device 11 in this state. At this time, although the atmosphere flows into the exhaust passage 29 (including the first to fourth exhaust pipes 21 to 24), since only a small amount of oxygen in the atmosphere comes into contact with the dust 36 accumulated on the inner wall of the exhaust passage 29, of the accumulated dust 36, only the dust 36 on the surface is burned, and the temperature inside the exhaust passage 29 increases only slightly. Next, to the outlet for cleaning 88c (the third port) of the three-way change-over valve 88, one end of the pipe for cleaning 92 of the dust burning and separating device 91 is connected. Moreover, the first insertion tube 51 is inserted into the first opening 12b with the first handle 71 at the top end of the first valve holder 61 being held. At this time, part of the dust 36 accumulated on the inner wall of the first opening 12b is scraped off by the first insertion tube 51 and is separated from the inner wall of the first opening 12b. This makes it possible to insert the first insertion tube 51 into the first opening 12b with ease even when the first opening 12b is formed in the bottom wall 12a of the relatively deep chamber 12. In the same manner as described above, the second to fourth insertion tubes 52 to 54 are inserted into the second to fourth openings 12c to 12e, respectively, with the second to fourth handles 72 to 74 at the top ends of the second to fourth valve holders 62 to 64 being held. At this time, the opening and closing valves for cleaning 31 to 34 maintain the first to fourth openings 12b to 12e in an open state. In this state, the three-way change-over valve 88 is switched in such a way that the first port 88a communicates with the outlet for cleaning 88c to drive the suction pump for cleaning 93.

Immediately after the suction pump for cleaning 93 is started, the induction motor 96 is rotated at low speed by the inverter 97 to keep the flow rate of the Ar gas or atmosphere in the exhaust passage 29 low. As a result, the dust 36 accumulated on the inner wall of the exhaust passage 29 is gradually burned. However, the dust 36 accumulated on the inner wall of the exhaust passage 29 is not separated therefrom. After a predetermined time has elapsed, the induction motor 96 is rotated at medium speed by the inverter 97 to increase the flow rate of the atmosphere in the exhaust passage 29. As a result, the dust 36 accumulated on the inner wall of the exhaust passage 29 is further burned. However, the dust 36 accumulated on the inner wall of the exhaust passage 29 is not separated therefrom. When a predetermined time has elapsed in this state, since all the dust 36 accumulated on the inner wall of the exhaust passage 36 is burned and becomes stable $SiO_2$, the induction motor 96 is rotated at high speed by the inverter 97 to further increase the flow rate of the atmosphere in the exhaust passage 29. As a result, most of the dust 36 accumulated on the inner wall of the exhaust passage 29 is separated and sucked, and, as a result of the sucked atmosphere being passed through the cyclone for cleaning 94, the dust 36 is detached from the atmosphere and is accumulated in the dust chamber for cleaning 94a. As a result, it is possible to remove most of the dust 36 accumulated on the inner wall of the exhaust passage 29 without a sudden increase in the temperature and the pressure in the exhaust passage 29.

On the other hand, since a small amount of dust 36 that could not be separated and captured by the cyclone for cleaning 94 and had been discharged from the funnel 98a for a scrubber after having passed through the cyclone 94 adheres to the liquid (for example, water) sprayed out of the shower nozzles 98c for a scrubber in the tank 98b for a scrubber and is captured, there is no possibility that the atmosphere is polluted with the dust 36. Moreover, when the above-described dust burning and separating device 91 completes an operation to burn the dust 36 in the exhaust passage 29 and an operation to separate most of the dust 36 that has been burned completely, the controller in the control box 87 is turned on in a state in which the suction pump for cleaning 93 is rotated at high speed by maximizing the rotation speed of the induction motor 98 by maximizing the frequency of the inverter 97 (for example, 60 Hz). The controller drives the first to fourth solenoid controlled valves to control opening and closing of the first to fourth opening and closing valves for cleaning 31 to 34, respectively. Specifically, the controller controls the first to fourth solenoid controlled valves based on the map stored in the memory, that is, the time chart (FIG. 5) that opens and closes the first to fourth opening and closing valves for cleaning 31 to 34, not at the same time but at different times, one by one three times each time (the number of opening and closing operations can be set at an arbitrary number). As a result, pressure fluctuations in which the exhaust passage 29 becomes a negative pressure when all of the first to fourth opening and closing valves for cleaning 31 to 34 are closed and the exhaust passage 29 returns to the atmospheric pressure when any one of the first to fourth opening and closing valves for cleaning 31 to 34 is opened occur in the exhaust passage. That is, the pressure inside the exhaust passage 29 fluctuates greatly. As a result, it is possible to separate all the dust 36 accumulated on the inner wall of the exhaust passage 29 reliably by the above-described pressure difference. Therefore, since there is no need to detach the first to fourth exhaust pipes 21 to 24, the collective exhaust pipe 26, and the like at the time of cleaning of the exhaust passage 29, it is possible to shorten the time required to clean the exhaust passage 29. Incidentally, most of the dust 36 separated from the inner wall of the exhaust passage 29 is separated and captured by the cyclone for cleaning 94, and the remaining dust 36 is captured by the scrubber for cleaning 98.

Since it is possible to remove all the dust 36 accumulated on the inner wall of the exhaust passage 29 in this manner, it is possible to suppress the pressure fluctuations in the chamber 12 when a silicon single crystal is pulled upwardly. As a result, it is possible to prevent the pressure fluctuations in the chamber 12 from affecting the silicon single crystal pulling conditions. Moreover, since the first to fourth insertion tubes 51 to 54 are inserted in the first to fourth openings 12b to 12e in a state in which the first to fourth opening and closing valves for cleaning 31 to 34 are held by the first to fourth valve holders 61 to 64, the first to fourth opening and closing valves for cleaning 31 to 34 can open and close the first to fourth openings 12b to 12e reliably in a stable state.

When cleaning of the exhaust passage 29 by the cleaning apparatus 30 is completed, it is necessary simply to detach the first to fourth opening opening-and-closing units 81 to 84 from the first to fourth openings 12b to 12e, detach the pipe for cleaning 92 from the outlet for cleaning 88c, and switch the three-way change-over valve 88 in such a way that the first port 88a communicates with the second port 88b. This greatly reduces the time required to clean the above-described exhaust passage 29 and makes it possible to clean the exhaust passage 29 with great ease.

<Second Embodiment>

FIG. 6 depicts a second embodiment of the present invention. In FIG. 6, the same reference numerals as those in FIG. 1 denote the same component elements. In this embodiment, first to fourth valve holders 121 to 124 provided in the first to fourth flange portions 51a to 54a in a standing manner are formed to have a virtually L shape. The first to fourth valve holders 121 to 124 are formed of first to fourth attachment portions 121a to 124a attached to the first to fourth flange portions 51a to 54a, the first to fourth attachment portions 121a to 124a in which first to fourth through holes 121b to 124b are formed, the first to fourth through holes 121b to 124b whose diameters are the same as those of the thorough holes of the first to fourth insertion tubes 51 to 54 and whose hole centers coincide with those of the thorough holes of the first to fourth insertion tubes 51 to 54, and first to fourth leg portions 121c to 124c provided at the first to fourth attachment portions 121a to 124a and extending in a direction away from the first to fourth flange portions 51a to 54a. One end of each of the first to fourth opening and closing valves for cleaning 31 to 34 is pivotally mounted on the top face of a corresponding one of the first to fourth attachment portions 121a to 124a. Moreover, the base ends of the first to fourth air cylinders 131 to 134 are pivotally mounted on the top ends of the first to fourth leg portions 121c to 124c, and the tips of first to fourth piston rods 131a to 134a of the first to fourth air cylinders 131 to 134 are pivotally mounted on the other ends of the first to fourth opening and closing valves for cleaning 31 to 34. Component elements other than those described above are configured in the same manner as in the first embodiment.

In a cleaning apparatus 120 configured as described above, even when air cylinders with a relatively small diameter are used as the first to fourth air cylinders 131 to 134, it is possible to make the first to fourth opening and closing valves for cleaning 31 to 34 perform opening and closing operation with a relatively small force. Since the operations other than that described above are almost the same as the operations in the first embodiment, overlapping explanations will be omitted.

<Third Embodiment>

Figure 7A:
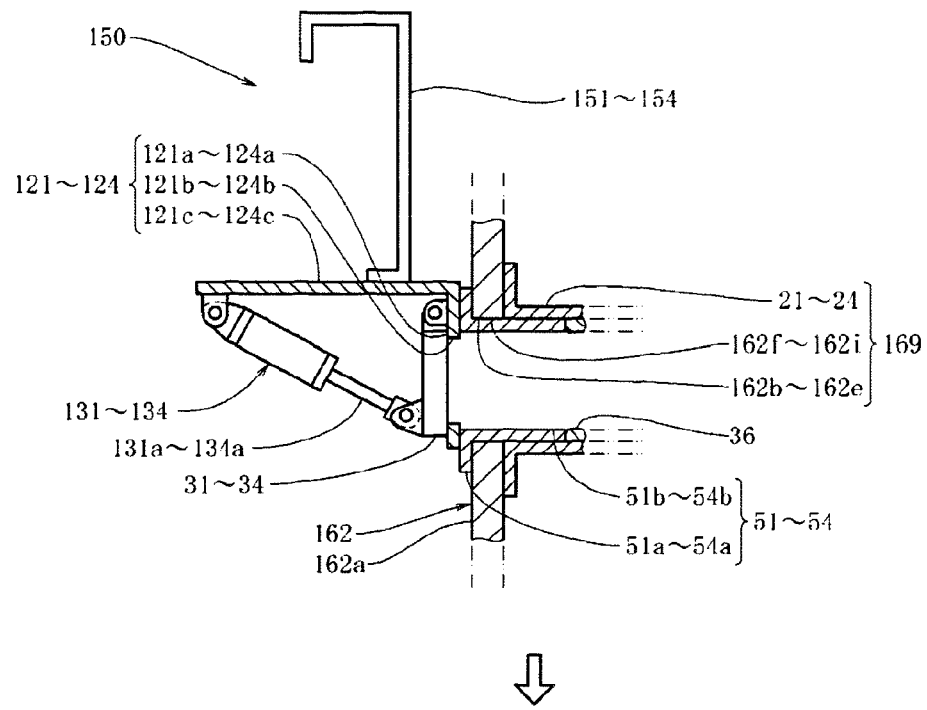
FIG. 7A and 7B are sectional views of a principal portion, the sectional view of a state in which an insertion tube of a cleaning apparatus of a third embodiment of the present invention is inserted into an opening and an opening and closing valve for cleaning is opened and closed by an air cylinder.
Figure 7B:
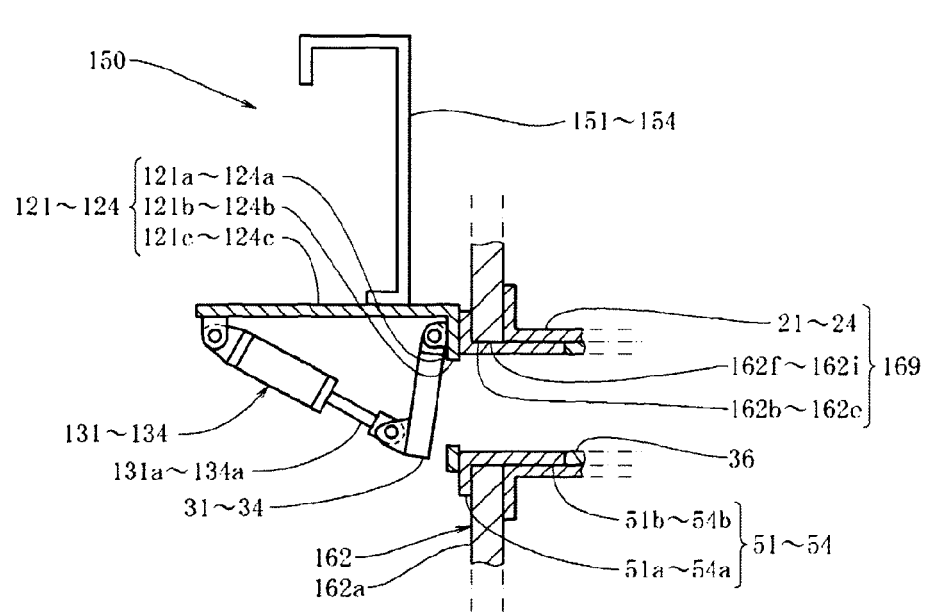

FIG. 7 depicts a third embodiment of the present invention. In FIG. 7, the same reference numerals as those in FIG. 6 denote the same component elements. In this embodiment, first to fourth hooks 151 to 154 are attached to the first to fourth leg portions 121c to 124c, respectively, of the first to fourth valve holders 121 to 124. Moreover, first to fourth openings 162b to 162e are formed in a side wall 162a of a chamber 162, and first to fourth communicating holes 162f to 162i are formed in the side wall 162a of the chamber 162 in such a way as to extend in a horizontal direction. Furthermore, the first to fourth openings 162b to 162e, the first to fourth communicating holes 162f to 162i, the first to fourth exhaust pipes 21 to 24, and the collective exhaust pipe form an exhaust passage 169. Component elements other than those described above are configured in the same manner as in the second embodiment.

In a cleaning apparatus 150 configured as described above, by inserting the first to fourth insertion tubes 51 to 54 into the first to fourth openings 162b to 162e while holding the first to fourth hooks 151 to 154, even when the first to fourth openings 162b to 162e are formed in the side wall 162a near the bottom wall of the relatively deep chamber 162, it is possible to insert the first to fourth insertion tubes 51 to 54 into the first to fourth openings 162b to 162e with ease. Since the operations other than that described above are almost the same as the operations in the first embodiment, overlapping explanations will be omitted.

Incidentally, in the above-described first to third embodiments, a silicon single crystal has been described as a semiconductor crystal. However, the semiconductor crystal may be a silicon polycrystal, a GaAs single crystal, a GaAs polycrystal, an InP single crystal, an InP polycrystal, a ZnS single crystal, a ZnS polycrystal, a ZnSe single crystal, or a ZnSe polycrystal. Moreover, in the above-described first to third embodiments, the inert gas has been described as the gas discharged from the exhaust passage, but the gas discharged from the exhaust passage may be non-oxidizing gas such as nitrogen gas. Furthermore, in the above-described first to third embodiments, after the dust accumulated in the exhaust passage is burned and most of the dust that has been burned completely is separated by the dust burning and separating device, all of the remaining dust in the exhaust passage is separated and removed by opening and closing of the openings of the exhaust passage by the opening and closing valves for cleaning. However, when there is no possibility of sudden burning of the dust, all of the dust accumulated in the exhaust passage may be separated and removed by opening and closing of the openings of the exhaust passage by the opening and closing valves for cleaning in a state in which the vacuum pump is operated as the suction pump for cleaning without using the dust burning and separating device. In this case, a powder separator (such as a cyclone) is provided in the collective exhaust pipe. Moreover, in the above-described first to third embodiments, the cleaning apparatus of the present invention is applied to the chamber having four openings in the bottom wall or the side wall. However, the cleaning apparatus of the present invention may be applied to a chamber having one to three or five or more openings in the bottom wall or the side wall. Furthermore, in the above-described first to third embodiments, the air cylinder has been described as the valve driving unit. However, the valve driving unit may be a hydraulic cylinder, a linear solenoid, or the like as long as it can open and close the opening and closing valve for cleaning.

In addition, in the above-described first to third embodiments, the cleaning apparatus of the present invention is applied to a silicon single crystal pulling device. However, the cleaning apparatus of the present invention may be applied to a cooling crucible induction melting casting apparatus or a cast furnace. The cooling crucible induction melting casting apparatus has, inside a high-frequency induction coil, a cooling copper crucible formed of strips of material having high electrical conductivity and high thermal conductivity (generally, copper), the strips electrically insulated from each other in a circumferential direction, the cooling copper crucible whose inside is water-cooled. The cooling copper crucible is formed as a melting container. When raw silicon is put into the cooling copper crucible and an alternating current is passed through the high-frequency induction coil, since strip-shaped pieces forming the cooling copper crucible are electrically separated from each other, the current forms a loop in each piece, and the current on the inner wall side of the cooling crucible forms a magnetic field in the cooling crucible, making it possible to heat and melt the silicon in the crucible. The molten silicon experiences a force in the direction of the inward normal on the molten silicon surface by the interaction between the magnetic field generated by the current on the inner wall of the cooling crucible and the current on the molten silicon skin, and melting is performed in a state in which the silicon is not in contact with the crucible. As a result, it is possible to cast a silicon polycrystal in a state in which the molten silicon rarely makes contact with the crucible or the mold. Moreover, the above-described cast furnace is used to manufacture a silicon polycrystal used in a solar battery. Specifically, the silicon material stored in the crucible in the cast furnace is melted at a high temperature that is higher than or equal to 140° C. and is then cooled and is crystallized. In this way, a silicon polycrystal is manufactured.

INDUSTRIAL APPLICABILITY

A cleaning apparatus and a cleaning method of the present invention can be used as an apparatus and a method for cleaning an exhaust passage for a semiconductor crystal manufacturing device, the apparatus and the method that can remove the dust accumulated in an exhaust passage efficiently and thereby shorten the time required to clean the exhaust passage and suppress fluctuations of the pressure inside a chamber when a semiconductor crystal is manufactured.

The invention claimed is:

1. An apparatus for cleaning an exhaust passage for a semiconductor crystal manufacturing device, the exhaust passage provided in a chamber to discharge gas in the chamber of the semiconductor crystal manufacturing device, the cleaning apparatus comprising:
   an opening and closing valve;
   a valve holder holding the opening and closing valve;
   an insertion tube extending from the valve holder and detachably attachable to an opening of the exhaust passage from an inside of the chamber, the insertion tube configured to extend into the opening of the exhaust passage when attached to thereto such that the opening and closing valve intermittently opens and closes the opening in a suction state; and
   a valve driver configured to drive the opening and closing valve such that dust accumulated in the exhaust passage is removed by sucking the dust from the outside of the chamber.

2. The apparatus for cleaning the exhaust passage for the semiconductor crystal manufacturing device according to claim 1,
   wherein:
   the insertion tube has a flange making contact with an end face of the opening; and
   the valve holder is attached to the flange.

3. The apparatus for cleaning the exhaust passage for the semiconductor crystal manufacturing device according to claim 2, wherein
   the valve holder is provided in such a way as to extend in a direction away from the insertion tube and has a handle at a tip thereof.

4. The apparatus for cleaning the exhaust passage for the semiconductor crystal manufacturing device according to claim 2, wherein
   a hook is attached to the valve holder.

5. The apparatus for cleaning the exhaust passage for the semiconductor crystal manufacturing device according to claim 1, wherein
   the valve driver is a fluid pressure cylinder.

6. The apparatus for cleaning the exhaust passage for the semiconductor crystal manufacturing device according to claim 5, wherein
   a cycle of the intermittent opening-and-closing of the opening by the valve driver is 1 to 30 seconds.

7. The apparatus for cleaning the exhaust passage for the semiconductor crystal manufacturing device according to claim 1, wherein
   a cycle of the intermittent opening-and-closing of the opening by the valve driver is 1 to 30 seconds.

8. The apparatus for cleaning the exhaust passage for the semiconductor crystal manufacturing device according to claim 1, wherein the opening and closing valve extends into the chamber.

* * * * *